(12) United States Patent
You et al.

(10) Patent No.: US 10,187,994 B2
(45) Date of Patent: Jan. 22, 2019

(54) CAPACITOR AND METHOD OF MANUFACTURING THE SAME

(71) Applicant: SAMSUNG ELECTRO-MECHANICS CO., LTD., Suwon-si, Gyeonggi-do (KR)

(72) Inventors: Su Youn You, Suwon-si (KR); Jae Yeol Choi, Suwon-si (KR); Hyun Hee Gu, Suwon-si (KR); Byoung Jin Chun, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/288,299

(22) Filed: Oct. 7, 2016

(65) Prior Publication Data

US 2017/0127521 A1 May 4, 2017

(30) Foreign Application Priority Data

Oct. 29, 2015 (KR) .................. 10-2015-0151068
Feb. 24, 2016 (KR) .................. 10-2016-0021731

(51) Int. Cl.
*H01G 2/06* (2006.01)
*H01G 4/00* (2006.01)
(Continued)

(52) U.S. Cl.
CPC .............. *H05K 1/181* (2013.01); *H01G 2/06* (2013.01); *H01G 2/065* (2013.01); *H01G 4/005* (2013.01);
(Continued)

(58) Field of Classification Search
CPC .......... H01G 2/06; H01G 2/065; H01G 4/005; H01G 4/0248
See application file for complete search history.

(56) References Cited

U.S. PATENT DOCUMENTS 7,280,342 B1 * 10/2007 Randall .................. H01G 4/232
  361/303
8,964,353 B2 2/2015 Kim et al.
(Continued)

FOREIGN PATENT DOCUMENTS

CN  103854855 A  6/2014
CN  103871742 A  6/2014
(Continued)

OTHER PUBLICATIONS

Korean Office Action dated Mar. 15, 2017, issued in Korean patent application No. 10-2016-0021731. (w/ English translation).
(Continued)

*Primary Examiner* — Hoa C Nguyen
(74) *Attorney, Agent, or Firm* — McDermott Will & Emery LLP

(57) ABSTRACT

A capacitor includes a body, first and second external electrodes, and first and second auxiliary external electrodes. The body includes first and second internal electrodes each having first and second lead portions exposed to one surface of the body. The first and second external electrodes are disposed on the one surface of the body and electrically connected to the first and second internal electrodes, respectively. The first and second auxiliary external electrodes are electrically connected to the first and second external electrodes, respectively, and cover portions of surfaces of the body connected to the one surface of the body.

42 Claims, 12 Drawing Sheets

(51) Int. Cl.
*H05K 1/18* (2006.01)
*H01G 4/005* (2006.01)
*H01G 4/12* (2006.01)
*H01G 4/248* (2006.01)
*H01G 4/30* (2006.01)
*H05K 1/11* (2006.01)
*H01G 4/012* (2006.01)
*H01G 4/232* (2006.01)

(52) U.S. Cl.
CPC ............... *H01G 4/012* (2013.01); *H01G 4/12* (2013.01); *H01G 4/232* (2013.01); *H01G 4/248* (2013.01); *H01G 4/30* (2013.01); *H05K 1/111* (2013.01); *H05K 2201/10015* (2013.01); *H05K 2201/10636* (2013.01); *Y02P 70/611* (2015.11)

(56) References Cited

U.S. PATENT DOCUMENTS

| | | | |
|---|---|---|---|
| 9,218,910 B2 | 12/2015 | Kim | |
| 9,269,491 B2 | 2/2016 | Park et al. | |
| 2010/0020467 A1* | 1/2010 | Yoon | H01G 4/224 361/305 |
| 2013/0050893 A1* | 2/2013 | Kim | H01G 4/228 361/306.3 |
| 2013/0120899 A1 | 5/2013 | Chung et al. | |
| 2014/0063687 A1* | 3/2014 | Saito | H01G 4/228 361/308.1 |
| 2014/0160621 A1 | 6/2014 | Yoon et al. | |
| 2014/0177129 A1 | 6/2014 | Lee | |
| 2015/0014038 A1 | 1/2015 | Park et al. | |
| 2015/0083475 A1 | 3/2015 | Kim et al. | |
| 2015/0114700 A1 | 4/2015 | Park et al. | |
| 2015/0318113 A1 | 11/2015 | Kim et al. | |

FOREIGN PATENT DOCUMENTS

| | | |
|---|---|---|
| CN | 103887066 A | 6/2014 |
| CN | 104282435 A | 1/2015 |
| JP | 2006-086359 A | 3/2006 |
| KR | 10-2013-0052874 A | 5/2013 |
| KR | 10-2014-0081360 A | 7/2014 |
| KR | 10-2014-0143321 A | 12/2014 |
| KR | 10-2015-0006623 A | 1/2015 |
| KR | 10-2015-0033392 A | 4/2015 |
| KR | 10-1514558 B1 | 4/2015 |

OTHER PUBLICATIONS

First Office Action issued in Chinese Patent Application No. 201610921161.3, dated Jul. 19, 2018 (English translation).

* cited by examiner

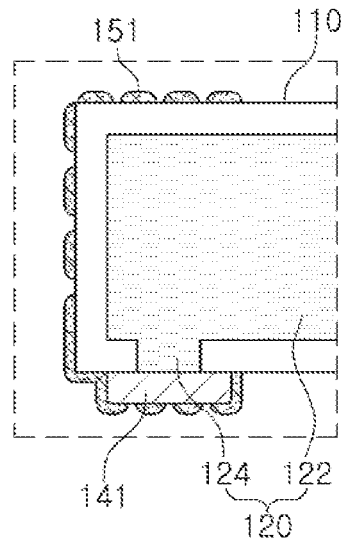
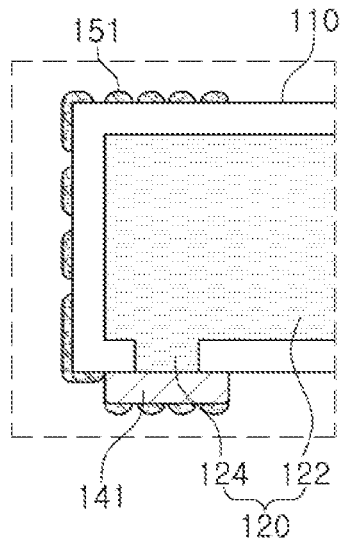
FIG. 6A  FIG. 6B
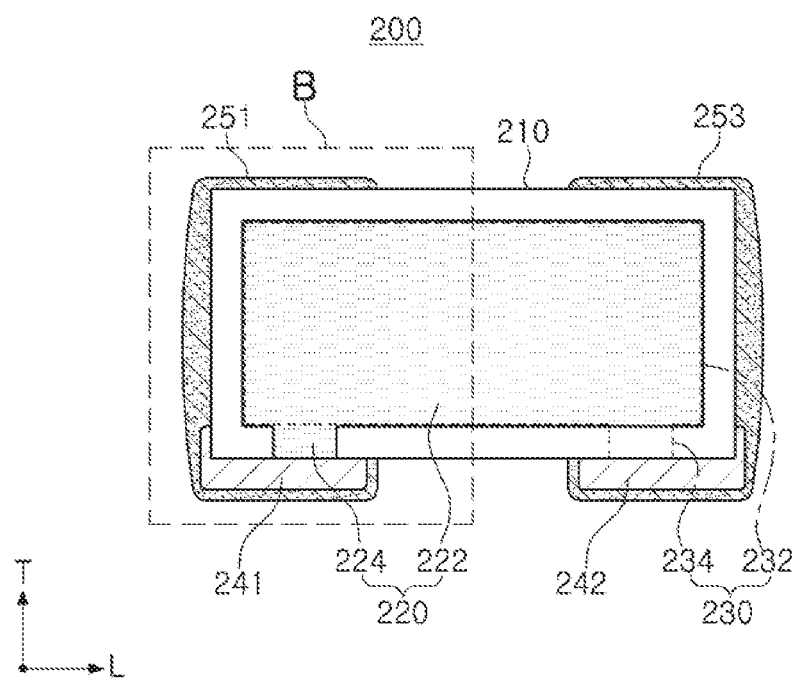
FIG. 7

CAPACITOR AND METHOD OF MANUFACTURING THE SAME

CROSS-REFERENCE TO RELATED APPLICATION(S)

This application claims benefit of priority to Korean Patent Applications Nos. 10-2015-0151068 filed on Oct. 29, 2015 and 10-2016-0021731 filed on Feb. 24, 2016, in the Korean Intellectual Property Office, the disclosures of which are incorporated herein by reference in their entireties.

BACKGROUND

1. Field

The present disclosure relates to a capacitor and a method of manufacturing the same.

2. Description of Related Art

In accordance with improvements in the performance of miniaturized information technology (IT) products, the requirements for products to have small sizes while providing ultra-high capacitances have increased. Therefore, among existing multilayer ceramic capacitors (MLCCs), a bottom land ceramic capacitor (BLCC), in which external electrodes are formed on a mounting surface, has been studied as a new type of capacitor. The external electrodes are formed on the mounting surface, such that an area of internal electrodes that may provide capacitance, as well as a size of the capacitor in a length direction, may be increased. As a result, an overlap region between internal electrodes is increased, such that capacitance of the resulting capacitor can be significantly as compared to that of a conventional capacitor having the same size. In addition, other improvements in capacitor characteristics may be secured such as a decrease in acoustic noise, warpage strength, and the like.

However, BLCCs may experience limitations as a result of the external electrodes being only formed on the mounting surface of a hexahedral body. In detail, since the capacitor should only be loaded in a direction of the mounting surface on which the external electrodes are formed when it is loaded, product workability and convenience of customer use may be decreased. In addition, a soldering area is decreased as compared to the MLCC according to the related art, such that adhesion strength between the capacitor and a circuit board on which the capacitor is mounted may be weak.

Therefore, a structure of a capacitor capable of facilitating production work and adhesion strength between the capacitor and the circuit board on which the capacitor is mounted needs to be developed.

SUMMARY

An exemplary embodiment in the present disclosure may provide a capacitor including auxiliary external electrodes formed on side surfaces of a body, such that adhesion strength between the capacitor and a circuit board at the time of mounting the capacitor on the circuit board may be improved and an appearance of the body may be protected due to an effect of sealing the side surfaces of the body. A method of manufacturing the same is also provided.

According to an exemplary embodiment, a capacitor may include a body, first and second external electrodes, and first and second auxiliary external electrodes. The body includes first and second internal electrodes each having first and second lead portions exposed to a lower surface of the body. The first and second external electrodes are disposed on the lower surface of the body and are electrically connected to the first and second internal electrodes, respectively. The first and second auxiliary external electrodes are electrically connected to the first and second external electrodes, respectively, and are disposed on portions of both side surfaces of the body, respectively. Capacitance of the capacitor may be significantly increased and adhesion strength between the capacitor and a circuit board may be improved.

BRIEF DESCRIPTION OF DRAWINGS

The above and other aspects, features, and advantages of the present disclosure will be more clearly understood from the following detailed description taken in conjunction with the accompanying drawings, in which:

FIGS. 5A through 5D, 6A, and 6B are enlarged views schematically illustrating part A of FIG. 4 in various illustrative embodiments;

FIG. 7 is a cross-sectional view schematically illustrating a capacitor according to another exemplary embodiment;

DETAILED DESCRIPTION

Hereinafter, exemplary embodiments of the present disclosure will be described in detail with reference to the accompanying drawings. In particular, capacitors according to exemplary embodiments will be described.

Figure 1:
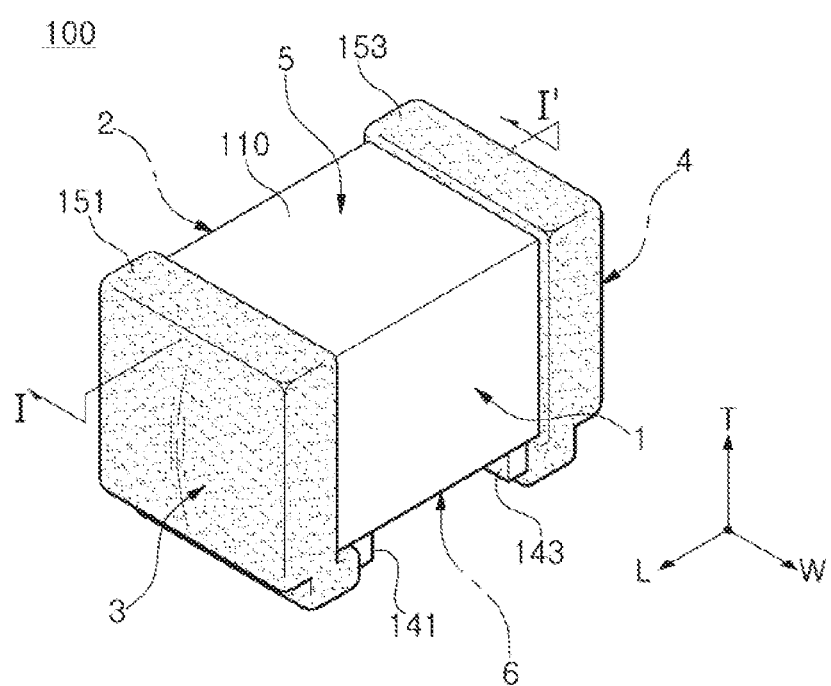
FIG. 1 is a perspective view schematically illustrating a capacitor according to an exemplary embodiment.
Figure 2:
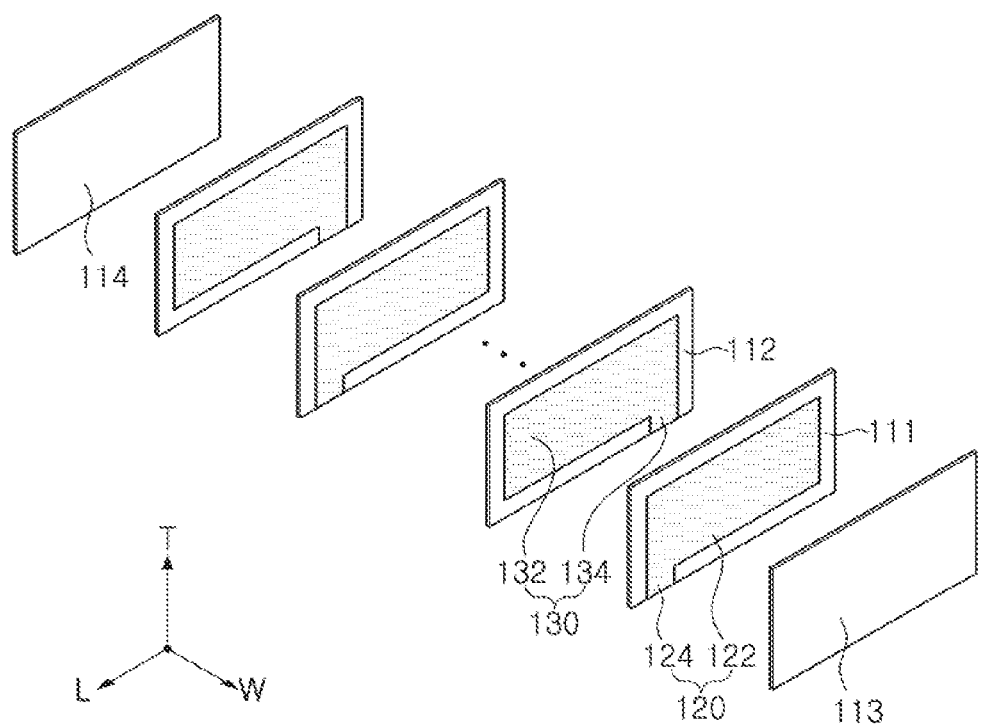
FIGS. 2 and 3 are, respectively, an exploded view and a perspective view schematically illustrating a body according to the exemplary embodiment.
Figure 3:
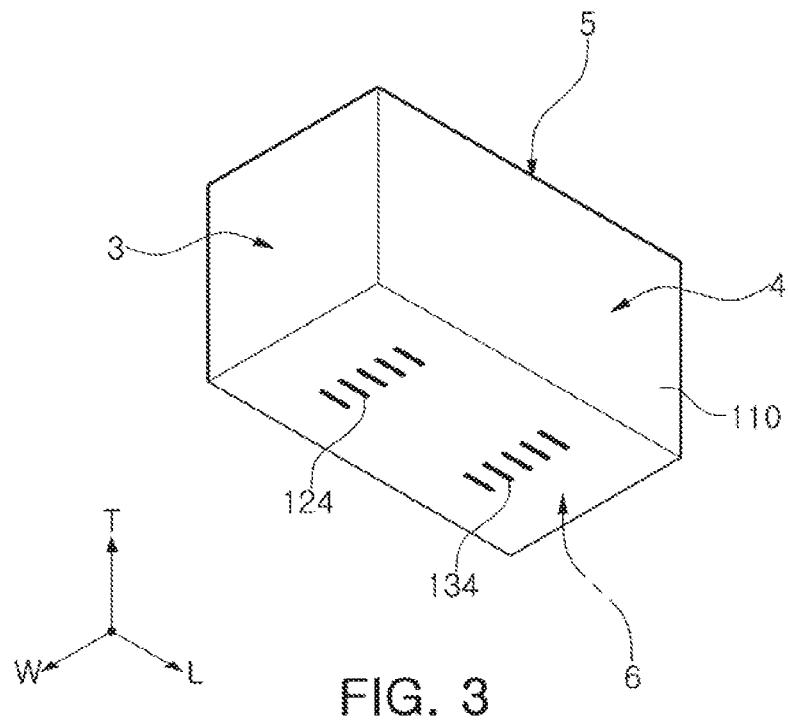
Figure 4:
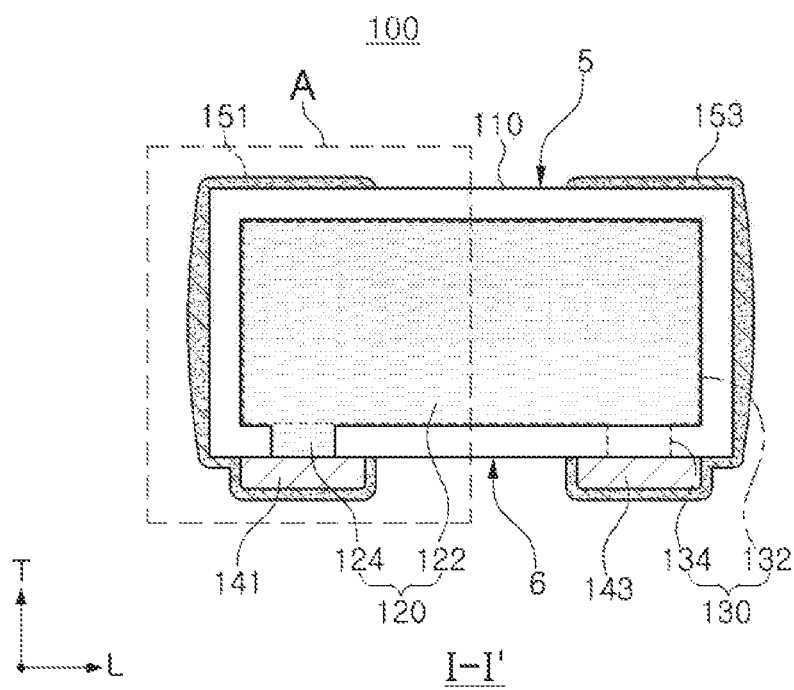
FIG. 4 is a cross-sectional view schematically illustrating a capacitor according to the exemplary embodiment.

FIG. 1 is a perspective view schematically illustrating a capacitor according to an exemplary embodiment; FIGS. 2 and 3 are, respectively, an exploded view and a perspective view schematically illustrating a body according to an exemplary embodiment; and FIG. 4 is a cross-sectional view schematically illustrating a capacitor according to an exemplary embodiment.

Referring to FIGS. 1 through 3, a capacitor 100 according to an exemplary embodiment may include a body 110 including first internal electrodes 120 having first lead portions 124 exposed to one surface 6 of the body and second internal electrodes 130 stacked alternately with the first internal electrodes 120 with respective dielectric layers 111 and 112 interposed therebetween and having second lead portions 134 exposed to the one surface 6 of the body. First and second external electrodes 141 and 143 are formed on the one surface 6 of the body 110 and are electrically connected to the first and second internal electrodes 120 and 130, respectively. First and second auxiliary external electrodes 151 and 153 are electrically connected to the first and second external electrodes 141 and 143, respectively, and cover portions of surfaces 1-4 of the body 110 connected to the one surface 6 of the body 110.

The body 110 may have one surface 6, another surface 5 opposing (or disposed opposite to) the one surface, and lateral surfaces 1-4 connecting the one surface 6 and the other surface 5 to each other. That is, the body may have a hexahedral shape including first and second surfaces 1 and 2 opposing each other in a stacking direction (a width (W) direction) of the body 110, third and fourth surfaces 3 and 4 opposing each other in a length (L) direction, and fifth and sixth surfaces 5 and 6 opposing each other in a thickness (T) direction, but is not limited thereto.

In the illustrative embodiment shown in FIGS. 1-3, the fifth and sixth surfaces 6 and 5 of the body correspond to the one surface and the other surface of the body, respectively.

The body 110 may have an upper surface 5, a lower surface 6, and lateral or side surfaces 1-4 connecting (or each extending between) the upper surface 5 and the lower surface 6 to each other. The body 110 may include the first and second internal electrodes 120 and 130 each having the first and second lead portions 124 and 134 extended to the lower surface 6 of the body 110, and the lower surface 6 of the body 110 may correspond to the one surface 6 of the body 110. That is, the one surface of the body 110 may be the fifth surface and/or the lower surface of the body 110, and may be a mounting surface configured to be disposed in a mounting region of a circuit board.

The body 110 may be formed by stacking a plurality of dielectric layers 111 and 112 each having a respective first or second internal electrode 120 and 130 disposed thereon.

The plurality of dielectric layers constituting the body 110 may be in a sintered state, and adjacent dielectric layers may be integrated with each other so that boundaries therebetween are not readily apparent to the naked eye.

The dielectric layers may be formed by sintering ceramic green sheets containing ceramic powder particles, an organic solvent, and an organic binder. The ceramic powder, a high-k material, may include a perovskite material. The perovskite material may be a barium titanate ($BaTiO_3$)-based material, a strontium titanate ($SrTiO_3$)-based material, or the like, but is not limited thereto.

The internal electrodes 120 and 130 may be formed in the body 110. The internal electrodes may include the first internal electrodes 120 and the second internal electrodes 130 respectively having a first polarity and a second polarity and provided in pairs. The first and second internal electrodes 120 and 130 may be stacked to face each other with respective dielectric layers interposed therebetween.

The first and second internal electrodes 120 and 130 may be disposed perpendicularly to the one surface of the body, wherein the one surface of the body serves as a mounting surface of the capacitor.

The first and second internal electrodes 120 and 130 may be formed of conductive paste patterns containing a metal. The metal may be nickel (Ni), copper (Cu), palladium (Pd), or alloys thereof, but is not limited thereto.

The first and second internal electrodes may be printed on the ceramic green sheets constituting the dielectric layers using the conductive paste patterns by a printing method such as a screen printing method or a gravure printing method.

The ceramic green sheets on which the first and second internal electrodes are printed may be alternately stacked and sintered to form the body.

In the present disclosure, the first and second polarities refer to different polarities.

The first and second internal electrodes 120 and 130 may respectively include the first and second lead portions 124 and 134 exposed to the one surface of the body.

The capacitor according to the related art has a structure in which the first and second internal electrodes are exposed to respective side surfaces of the body connecting the one surface of the body and the other surface of the body opposing the one surface. In contrast, the capacitor according to the present disclosure has a structure in which the first and second internal electrodes are all exposed to the one surface of the body. Due to the structure described above, an area of overlap between adjacent first and second internal electrodes 120 and 130, corresponding to an area providing a capacitance portion, may be increased as compared to the capacitor according to the related art. As a result, a level of capacitance higher than that of the capacitor according to the related art may be implemented.

The capacitor according to an exemplary embodiment may be a vertical stack type capacitor.

The first and second lead portions 124 and 134 refer to regions of the first and second internal electrodes that are exposed to the one surface of the body. The first and second lead portions 124 and 134 may be formed by increasing lengths of internal electrode patterns forming the first and second internal electrodes in the thickness direction (the T direction).

The first and second internal electrodes 120 and 130 may form capacitance through regions 122 and 132 being overlapped with each other. In general, the first and second lead portions 124 and 134, which are connected to the first and second external electrodes 141 and 143 having different polarities, do not have regions overlapped with each other.

Since the first and second lead portions 124 and 134 are insulated from each other without being overlapped with each other, they may not cause an increase in the occurrence of defects such as short-circuits between the internal electrodes due to a phenomenon that the internal electrodes facing each other are pushed by cutting stress at the time of cutting a laminate for manufacturing the body.

Referring to FIG. 3, it may be appreciated that the first and second lead portions 124 and 134 are alternately exposed to the one surface of the body 110, that is, the lower surface of the body 110.

In addition, the first and second lead portions 124 and 134 may be spaced apart from edges of the one surface of the body 110 by a predetermined distance.

Referring to FIG. 4, the capacitor according to an exemplary embodiment may include the first external electrode 141 connected to the first lead portions 124 of the first internal electrodes exposed to the one surface 6 of the body 110 and the second external electrode 143 connected to the second lead portions 134 of the second internal electrodes exposed to the one surface 6 of the body 110. That is, the first and second external electrodes 141 and 143 may be formed on the one surface 6 of the body 110, that is, the lower surface of the body.

The first and second external electrodes 141 and 143 may be formed at positions spaced apart from edges of the one surface 6 of the body by 10 μm to 50 μm, and a distance between the first and second external electrodes 141 and 143 may be 30 μm to 40 μm.

When the distance between the first and second external electrodes 141 and 143 is 30 μm to 40 μm, a short-circuit between the first and second external electrodes 141 and 143 may be prevented.

The first and second external electrodes 141 and 143 may contain a metal.

The metal may be nickel (Ni), copper (Cu), tin (Sn), or alloys thereof.

The first and second external electrodes 141 and 143 may further contain an insulating material. The insulating material may be, for example, glass.

The first and second external electrodes 141 and 143 may be formed on the one surface 6 of the body 110 in order to be connected to the first and second lead portions 124 and 134, respectively.

In a case in which the first and second external electrodes 141 and 143 are formed on only the one surface 6 of the body 110, portions of solder fillets protruding from the body 110 may be decreased, and a chip size may be increased by a region corresponding to the decreased protruding portions. As a result, capacitance of the capacitor may be significantly increased at the same size. However, in the case in which the first and second external electrodes 141 and 143 are formed on only the one surface 6 of the body, areas of the first and second external electrodes 141 and 143 contacting the solder fillets may be decreased, such that adhesion strength between the capacitor and the circuit board may be weak.

FIGS. 5A through 5D, 6A, and 6B are enlarged views schematically illustrating part A of FIG. 4.

Referring to FIGS. 4, 5A through 5D, 6A, and 6B, the capacitor according to an exemplary embodiment may include the first and second auxiliary external electrodes 151 and 153 electrically connected to the first and second external electrodes 141 and 143, respectively, and covering portions of the surfaces 1-4 of the body connected to the one surface 6 of the body.

The first and second auxiliary external electrodes 151 and 153 may be formed to cover portions of the one surface 6 of the body on which the first and second external electrodes 141 and 143 are formed and portions of the surfaces 1-4 of the body connected to the one surface 6 of the body.

The first and second auxiliary external electrodes 151 and 153 may be extended from the first and second external electrodes 141 and 143 to surfaces 1-5 of the body on which the first and second external electrodes are not formed, respectively.

The first and second auxiliary external electrodes 151 and 153 may be formed on surfaces 1-6 of the body and surfaces of the external electrodes 141 and 143.

The first and second auxiliary external electrodes 151 and 153, which are different from the first and second external electrodes 141 and 143, may be formed of a metal unlike the external electrodes containing a conductive metal and glass. For example, in some examples, the first and second auxiliary external electrodes 151 and 153 include a metal different from the metal forming the first and second external electrodes 141 and 143. The metal may be nickel (Ni), copper (Cu), tin (Sn), or alloys thereof.

In a case in which the metal of the first and second auxiliary external electrodes 151 and 153 is copper (Cu), the copper is cheaper than gold (Au), silver (Ag), and the like, which are precious metals, and has electrical conductivity higher than those of the gold (Au), silver (Ag), and the like. Therefore, a cost required for manufacturing the first and second auxiliary external electrodes 151 and 153 may be decreased, and electrical connectivity between the first and second auxiliary external electrodes 151 and 153 and the first and second external electrodes 141 and 143 may be improved.

The first auxiliary external electrode 151 may be extended from the first external electrode 141 to a surface (e.g., 3) of the body connecting the one surface of the body 110 and the other surface of the body 110 to each other.

The first and second auxiliary external electrodes 151 and 153 may be extended to cover the surfaces 3 and 4 of the body connecting the one surface 6 of the body and the other surface 5 of the body to each other, and to cover portions of the other surface 5 of the body.

That is, electrodes having a two-layer structure including the external electrodes 141 and 143 and the auxiliary external electrodes 151 and 153 may be formed on the one surface 6 of the body, and electrodes having a single-layer structure including the auxiliary external electrodes 151 and 153 may be formed on portions of surfaces 1-4 of the body connected to the one surface 6 of the body.

The capacitor includes the first and second auxiliary external electrodes 151 and 153, such that an area in which a conductive material is formed on the surfaces of the body 110 may be increased. Therefore, plating layers may be easily formed, such that capacitance of the capacitor may be significantly increased and adhesion strength between the capacitor and the circuit board may be improved. In addition, workability and easiness of a loading work at the time of loading the capacitor may be improved, and an appearance of the capacitor may be protected due to an effect of sealing the surfaces of the body 110.

The first and second auxiliary external electrodes 151 and 153, which are different from the first and second external electrodes 141 and 143, may be formed of a metal unlike the external electrodes containing a conductive metal and glass. For example, in some examples, the first and second auxiliary external electrodes 151 and 153 include a metal different from the metal forming the first and second external electrodes 141 and 143. The metal may be nickel (Ni), copper (Cu), tin (Sn), or alloys thereof.

The first and second auxiliary external electrodes 151 and 153 may serve as seed layers for forming the plating layers. Therefore, the plating layers may be formed on the first and second external electrodes 141 and 143 and the first and second auxiliary external electrodes 151 and 153.

That is, the plating layers may be formed on the surfaces of the body as well as on the first and second external electrodes 141 and 143, such that the areas of the first and second external electrodes 141 and 143 contacting the solder fillets at the time of mounting the capacitor are increased, whereby the adhesion strength between the capacitor and the circuit board may be improved.

The first and second external electrodes 141 and 143 formed on the one surface 6 of the body 110 may actually serve as electrodes electrically connected to the outside, and the first and second auxiliary external electrodes 151 and 153 may be formed at a minimum thickness to serve to improve the adhesion strength between the capacitor and the circuit board at the time of mounting the capacitor on the circuit board.

The first and second auxiliary external electrodes 151 and 153 are not directly connected to the internal electrodes 120 and 130, but may be indirectly connected to the first and second internal electrodes 120 and 130 through the first external electrode 141 or the second external electrode 143.

The sum of a thickness of the first and second auxiliary external electrodes 151 and 153 and a thickness of the plating layers (not illustrated) formed on the first and second auxiliary external electrodes 151 and 153 may be 10% to 60% of a thickness of the first and second external electrodes 141 and 143.

The thickness of the first and second auxiliary external electrodes 151 and 153 (except the plating layer) may be 0.05 μm to 10 μm. The first and second auxiliary external electrodes 151 and 153, which serve as the seed layers for forming the plating layers, may be formed at a minimum thickness.

The plating layers may be formed to cover portions of the body and the first and second external electrodes 141 and 143. As a result, capacitance of the capacitor may be implemented and the adhesion strength between the capacitor and the circuit board may be increased, such that acoustic noise may be decreased.

In addition, since the plating layers are formed on a portion of the body 110 by the first and second auxiliary external electrodes 151 and 153, an appearance of the body may be protected.

Hereinafter, the first auxiliary external electrode 151 and the first external electrode 141 will be described with reference to FIGS. 4, 5A through 5D, 6A, and 6B. This description is not limited to the first auxiliary external electrode 151 and the first external electrode 141, but may also be applied to the second auxiliary external electrode 153 and the second external electrode 143.

Referring to FIGS. 4, 5A through 5D, 6A, and 6B, the first external electrode 141 may be formed to be spaced apart from an edge of the one surface 6 of the body 110.

The first auxiliary external electrode 151 may be formed to cover a portion of the first external electrode 141.

The body 110 may have one surface 6 and the other surface 5 opposing one surface, and the first external electrode 141 may have one side surface, the other side surface, and a lower surface connecting the one side surface and the other side surface to each other.

Figure 5A:
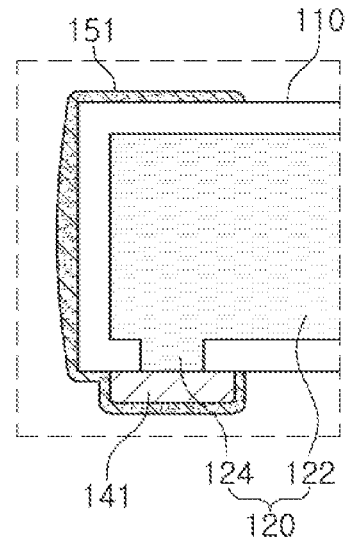
Figure 5B:
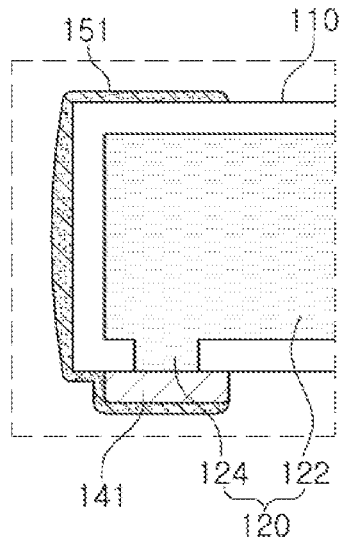
Figure 5C:
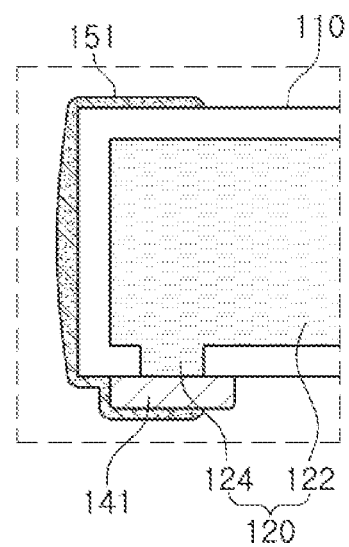
Figure 5D:
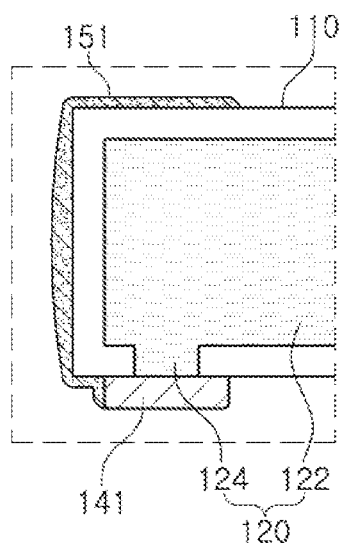

FIG. 5A illustrates a case in which the first auxiliary external electrode 151 is formed on the lower and all side surfaces of the first external electrode 141 to enclose the first external electrode 141, FIG. 5B illustrates a case in which the first auxiliary external electrode 151 is formed on the lower and one side surface of the first external electrode 141 to enclose the remaining region of the first external electrode 141 except another side surface of the first external electrode 141, FIG. 5C illustrates a case in which the first auxiliary external electrode 151 is extended from a portion of the lower surface of the first external electrode 141 to a portion of the other surface 5 of the body 110, and FIG. 5D illustrates a case in which the first auxiliary external electrode 151 is extended from the one side surface of the first external electrode 141 to a portion of the other surface 5 of the body 110.

A thickness of the first auxiliary external electrode 151 formed on a portion of the other surface 5 of the body 110 may be the same as or thinner than a thickness of the first auxiliary external electrode 151 formed on the surface (e.g., 3) of the body 110 connecting the one surface 6 of the body and the other surface 5 of the body to each other.

Referring to FIGS. 6A and 6B, the first auxiliary external electrode 151 may include a non-connecting portion (not illustrated) exposing the surface of the body. For example, FIG. 6A illustrates a case in which the first auxiliary external electrode 151 is formed on the lower and all side surfaces of the first external electrode 141 to enclose the first external electrode 141, and FIG. 6B illustrates a case in which the first auxiliary external electrode 151 is formed on the lower surface of the first external electrode 141 only to enclose the remaining region of the first external electrode 141 except one side surface of the first external electrode 141.

The first auxiliary external electrode 151, which serves as a seed layer for forming the plating layer, may have a minimum thickness. In this case (e.g., illustratively shown in FIGS. 6A and 6B), the first auxiliary external electrode 151 may include a region exposing the surface of the body.

The non-connecting portion of the first auxiliary external electrode 151 may be formed after a heat-treatment process when the first auxiliary external electrode 151 is formed.

As an area of the non-connecting portion becomes large, a uniform plating layer may not be secured. Therefore, the area of the non-connecting portion may be restricted so as to remain within a range in which the uniform plating layer may be secured.

FIG. 7 is a cross-sectional view schematically illustrating a capacitor 200 according to another exemplary embodiment; and FIGS. 8A through 8D are enlarged views schematically illustrating part B of FIG. 7.

A description of components of FIGS. 7 and 8A through 8D that are the same as the components illustrated in FIGS. 1 through 4, 5A through 5D, 6A, and 6B will be omitted.

Referring to FIGS. 7 and 8A through 8D, the first external electrode 241 may be extended to a portion of a surface 3 of the body 210 connected to the one surface 6 of the body 210. In this case, the first external electrode 241 may have an L shape extending onto two surfaces 3 and 6 of the body 210.

In this case, the first and second auxiliary external electrodes 251 and 253 may be extended from the first and second external electrodes 241 and 242 to cover entire surfaces 3 and 4 of the body connecting the one surface 6 of the body and the other surface 5 of the body to each other or to portions of the other surface 5 of the body.

Electrodes having a two-layer structure including the first and second external electrodes 241 and 242 and the first and second auxiliary external electrodes 251 and 253 and electrodes having a single-layer structure including the first and second auxiliary external electrode 251 and 253 may be formed on the surfaces 1-4 of the body 210 connected to the one surface 6 of the body 210.

Figure 8A:
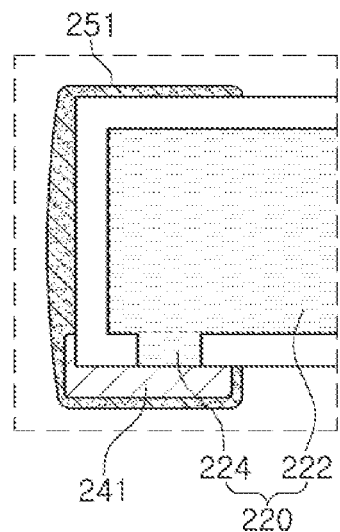
FIGS. 8A through 8D are enlarged views schematically illustrating part B of FIG. 7 in various illustrative embodiments.
Figure 8B:
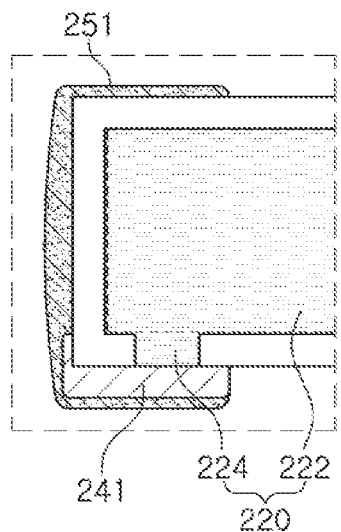
Figure 8C:
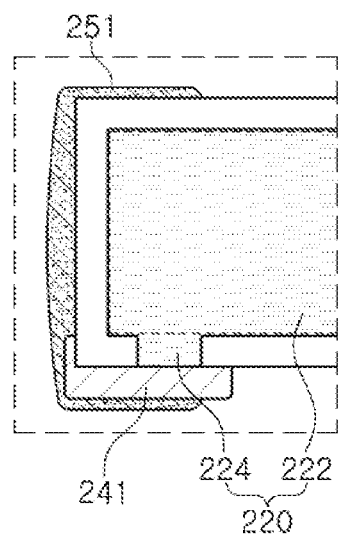
Figure 8D:
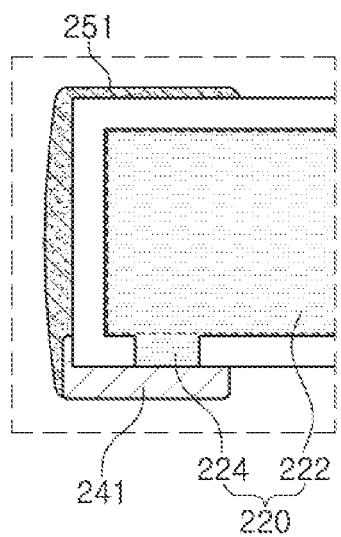

FIG. 8A illustrates a case in which the first auxiliary external electrode 251 is formed on the lower and all side surfaces of the first external electrode 241 to enclose the first external electrode 241, FIG. 8B illustrates a case in which the first auxiliary external electrode 251 is formed on the lower and one side surface of the first external electrode 241 to enclose the remaining region of the first external electrode 241 except another side surface of the first external electrode 241, FIG. 8C illustrates a case in which the first auxiliary external electrode 251 is extended from a portion of the lower surface of the first external electrode 241 to a portion of the other surface 5 of the body 210, and FIG. 8D illustrates a case in which the first auxiliary external electrode 251 is extended from the one side surface of the first external electrode 241 to a portion of the other surface 5 of the body 210.

Figure 9:
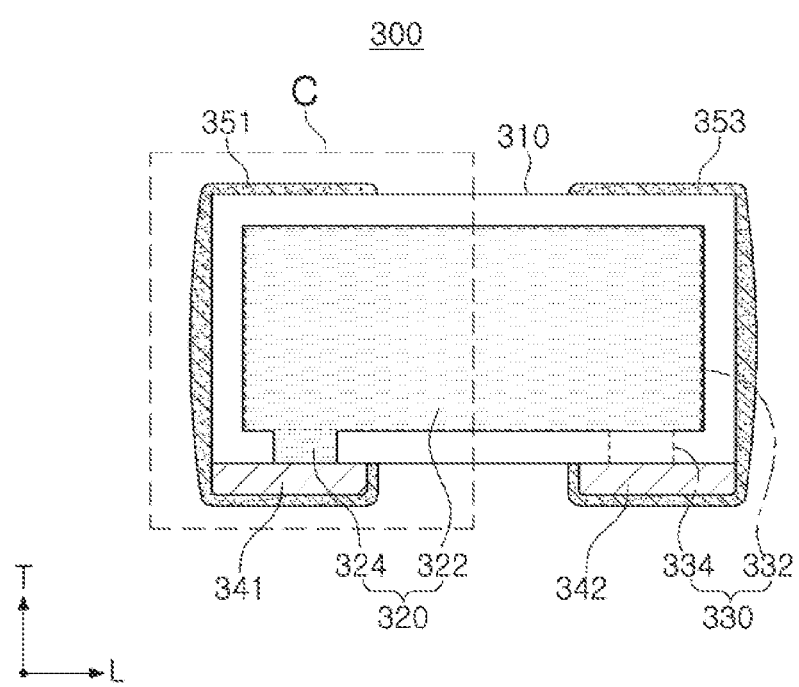
FIG. 9 is a cross-sectional view schematically illustrating a capacitor according to another exemplary embodiment.

FIG. 9 is a cross-sectional view schematically illustrating a capacitor 300 according to another exemplary embodiment; and FIGS. 10A through 10D are enlarged views schematically illustrating part C of FIG. 9.

A description of components of FIGS. 9 and 10A through 10D that are the same as the components illustrated in FIGS. 1 through 4, 5A through 5D, 6A, and 6B will be omitted.

The first external electrode 341 may be formed to an edge of the one surface of the body 310, for example such that one side surface of the first external electrode 341 is flush with (or aligned with) a side surface 3 of the body 310.

Figure 10A:
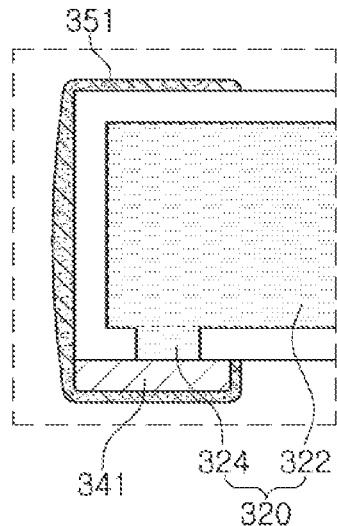
FIGS. 10A through 10D are enlarged views schematically illustrating part C of FIG. 9 in various illustrative embodiments.
Figure 10B:
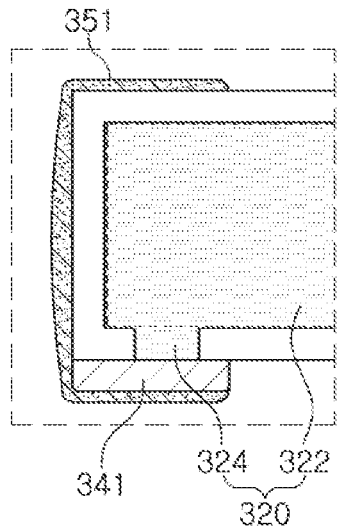
Figure 10C:
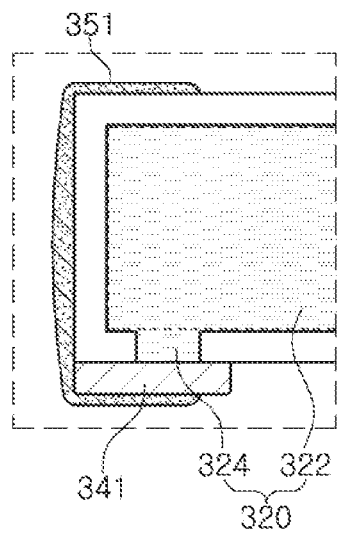
Figure 10D:
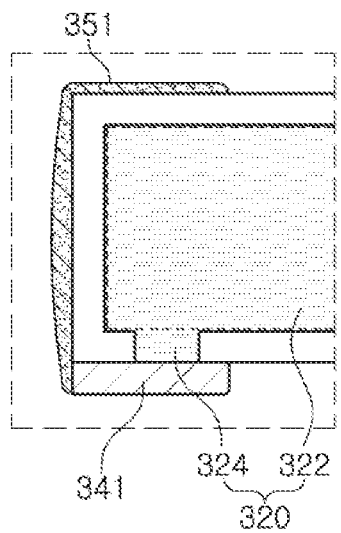
Figure 11:
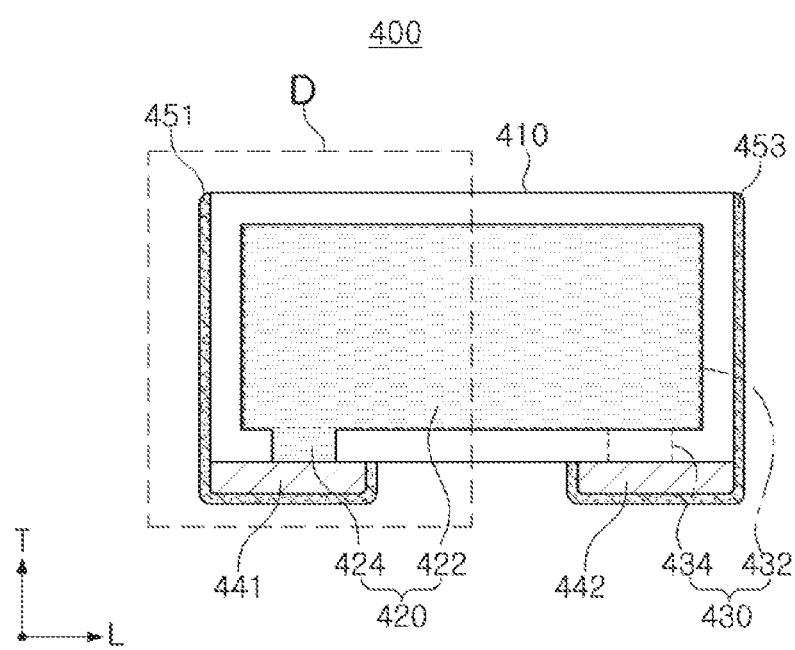
FIG. 11 is a cross-sectional view schematically illustrating a capacitor according to another exemplary embodiment.
Figure 12A:
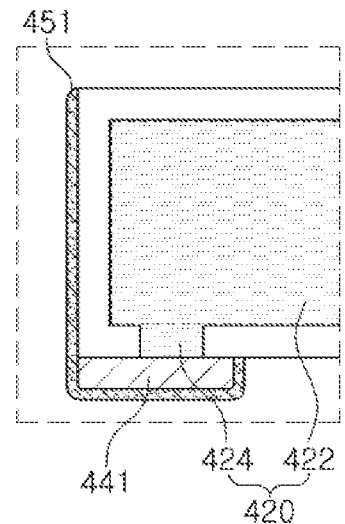
FIGS. 12A through 12D are enlarged views schematically illustrating part D of FIG. 11 in various illustrative embodiments.
Figure 12B:
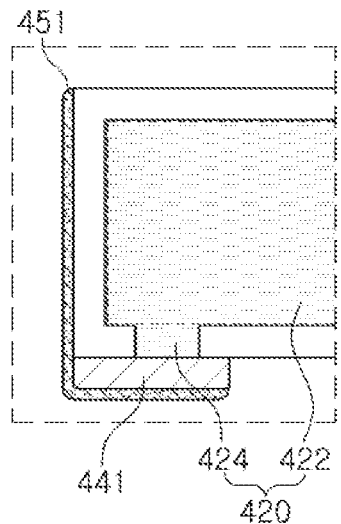
Figure 12C:
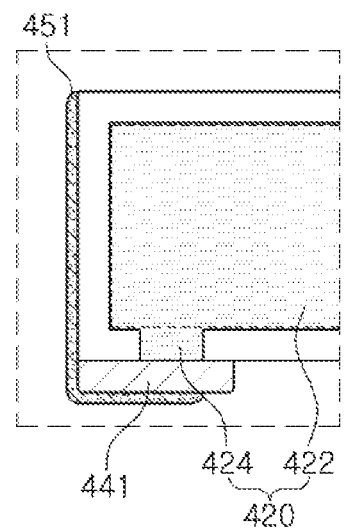
Figure 12D:
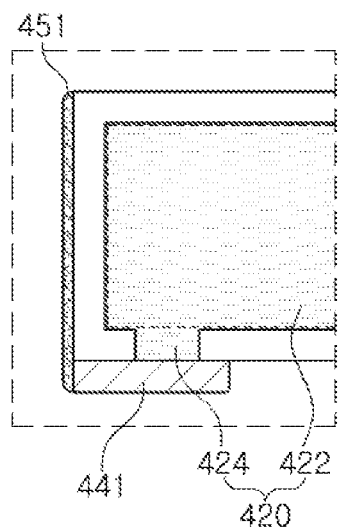

FIG. 10A illustrates a case in which the first auxiliary external electrode 351 is formed on the lower and all side surfaces of the first external electrode 341 to enclose the first external electrode 341, FIG. 10B illustrates a case in which the first auxiliary external electrode 351 is formed on the lower and one side surface of the first external electrode 341 to enclose the remaining region of the first external electrode 341 except another side surface of the first external electrode 341, FIG. 10C illustrates a case in which the first auxiliary external electrode 351 is extended from a portion of the lower surface of the first external electrode 341 to a portion of the other surface 5 of the body 310, and FIG. 10D illustrates a case in which the first auxiliary external electrode 351 is extended from the one side surface of the first external electrode 341 to a portion of the other surface 5 of the body 310.

That is, the first auxiliary external electrode 351 may be thinly applied at a minimum thickness from one side surface, the lower surface, and the other side surface of the first external electrode 341 to a portion of the other surface 5 of the body 310.

A thickness of the first auxiliary external electrode 351 formed on a portion of the other surface 5 of the body 310 may be the same as or thinner than a thickness of the first auxiliary external electrode 351 formed on the surface 3 of the body 310 connecting the one surface 6 of the body and the other surface 5 of the body to each other.

The first auxiliary external electrode 351 may be extended from the first external electrode 341 to a surface 3 of the body 310 connecting the one surface 6 of the body 310 and the other surface 5 of the body 310 to each other.

Figure 14:
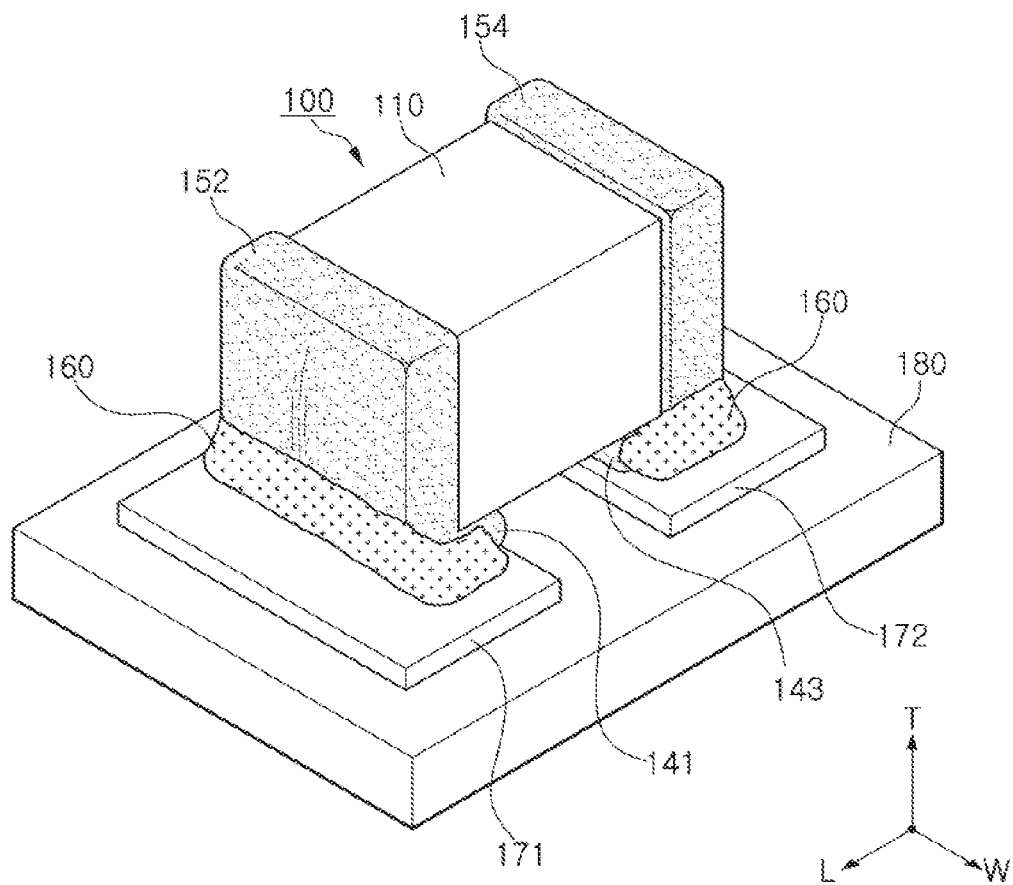
FIG. 14 is a perspective view schematically illustrating an assembly in which a capacitor according to an exemplary embodiment is mounted on a circuit board.

FIG. 14 is a perspective view schematically illustrating an assembly in which a capacitor 100 according to an exemplary embodiment is mounted on a circuit board 180.

Referring to FIG. 14, plating layers 152 and 154 may be formed on the first and second external electrodes (e.g., 141 and 143) and the first and second auxiliary external electrodes (e.g., 151 and 153).

The plating layers 152 and 154 may be formed at a uniform thickness on surfaces of the first and second external electrodes (e.g., 141 and 143) and the first and second auxiliary external electrodes (e.g., 151 and 153). That is, the plating layers 152 and 154 may have a form in which they are extended from the one surface 6 of the body 110 to the other surface 5 of the body 110. Therefore, an appearance of the capacitor 100 may be protected, and adhesion strength between the capacitor 100 and the circuit board 180 may be improved.

The plating layers 152 and 154 may be bonded to the solder fillets 160 at the time of mounting the capacitor 100 on the circuit board 180. Specifically, the solder fillets 160 may bond the plating layers to electrical contacts 171 and 172 of the circuit board 180.

The plating layers 152 and 154 may be formed of nickel (Ni), tin (Sn), or alloys thereof, but are not limited thereto.

The plating layers 152 and 154 may have a thickness of 1 μm to 10 μm.

TABLE 1

| Division | Thickness (μm) of Auxiliary External Electrode | Uniformity of Plating Layer | Delamination of Auxiliary External Electrode | Adhesion Strength between Capacitor and Circuit Board | Thickness Range of Capacitor |
|---|---|---|---|---|---|
| 1* | 0.05 (Ratio of Area of Non-connecting Portion to Entire Area of Auxiliary External Electrode is 12%) | Δ | ○ | Δ | ○ |
| 2 | 0.05 (Ratio of Area of Non-connecting Portion to Entire Area of Auxiliary External Electrode is 8%) | ○ | ○ | ○ | ○ |
| 3 | 2 | ○ | ○ | ○ | ○ |
| 4 | 4 | ○ | ○ | ○ | ○ |
| 5 | 6 | ○ | ○ | ○ | ○ |
| 6 | 8 | ○ | ○ | ○ | ○ |
| 7 | 10 | ○ | ○ | ○ | ○ |
| 8* | 12 | ○ | Δ | Δ | x |
| 9* | 14 | ○ | x | x | x |

*Comparative Example

Table 1 represents characteristic evaluation results of the uniformity of a plating layer, delamination of an auxiliary external electrode, adhesion strength between a capacitor and a circuit board, and whether or not a thickness range of the capacitor is satisfied depending on a thickness of the auxiliary external electrode in capacitors according to Inventive Examples.

The uniformity of the plating layer indicates whether or not a thickness of the plating layer is uniform, and the delamination of the auxiliary external electrode indicates an adhesion level between a body or the external electrode and the auxiliary external electrode. In a case in which the auxiliary external electrode is not delaminated from a lower surface of the external electrode, delamination was represented by "○", in a case in which the auxiliary external electrode is delaminated from a portion of the lower surface of the external electrode in the plating layer, delamination was represented by "Δ", and in a case in which the auxiliary external electrode was delaminated from the entire lower surface of the external electrode, delamination was represented by "x".

The adhesion strength between the capacitor and the circuit board indicates whether or not delamination occurs between the capacitor and the circuit board, shear of a body occurs, and a sign for the delamination between the capacitor and the circuit board and the shear of the body is generated after force is applied to the capacitor and the circuit board for a predetermined amount of time. In a case in which an adhesion defect is 0%, the adhesion strength was represented by "○", in a case in which an adhesion defect is 5% to 15%, the adhesion strength was represented by "Δ", and in a case in which an adhesion defect exceeds 15%, the adhesion strength was represented by "x".

The auxiliary external electrode may have a thickness enough to form the plating layer, and may include a non-connecting portion exposing a surface of the body.

However, in a case in which a ratio of an area of the non-connecting portion to an entire area of the auxiliary external electrode exceeds 10% (e.g., Division 1 in Table 1), uniformity of the plating layer may be decreased, such that the adhesion strength between the capacitor and the circuit board may not be secured.

In a case in which a thickness of the auxiliary external electrode exceeds 10 µm (e.g., Divisions 8 and 9 in Table 1), the auxiliary external electrode does not closely adhere to the body and the external electrode, such that a space may be generated between the auxiliary external electrode and the body and the external electrode. Therefore, delamination may occur between the plating layer and the external electrode, and plating may not be performed, such that the adhesion strength between the capacitor and the circuit board may also not be secured. In addition, a thickness of the capacitor may exceed a desired thickness range for the capacitor due to an increase in the thickness of the auxiliary external electrode.

Therefore, the auxiliary external electrode may be formed at a minimum thickness enough to form the plating layer, and may be formed in a thickness range (0.05 µm to 10 µm) in which an area of the non-connecting portion is not increased.

Hereinafter, methods of manufacturing a capacitor according to the present disclosure will be described.

A method of manufacturing a capacitor according to an exemplary embodiment may include stacking dielectric layers on which internal electrode patterns are formed to form a laminate having the internal electrode patterns exposed to one surface thereof, applying external electrode paste patterns to one surface of the laminate, firing the laminate and the external electrode paste patterns to obtain a body on which external electrodes are formed, and forming auxiliary external electrodes electrically connected to the external electrodes and covering portions of surfaces of the body connected to the one surface of the body.

The laminate may be formed by stacking a plurality of dielectric layers on which the internal electrode patterns are formed.

The internal electrode patterns may be exposed to the one surface of the body, and the external electrodes may be formed on the one surface of the body so as to be electrically connected to the internal electrode patterns.

The body 110 on which the external electrodes 141 and 143 are formed may be obtained through a firing process after the external electrodes are formed.

The external electrodes 141 and 143 may be formed by applying the external electrode paste patterns to the laminate.

The external electrode paste patterns may be applied using embossing and engraving jigs or be printed by a wheel type device or a screen printing method.

After the external electrodes 141 and 143 are formed, the laminate and the external electrodes may be sintered to obtain the body 110 including the internal electrodes connected to the external electrodes.

Figure 13A:
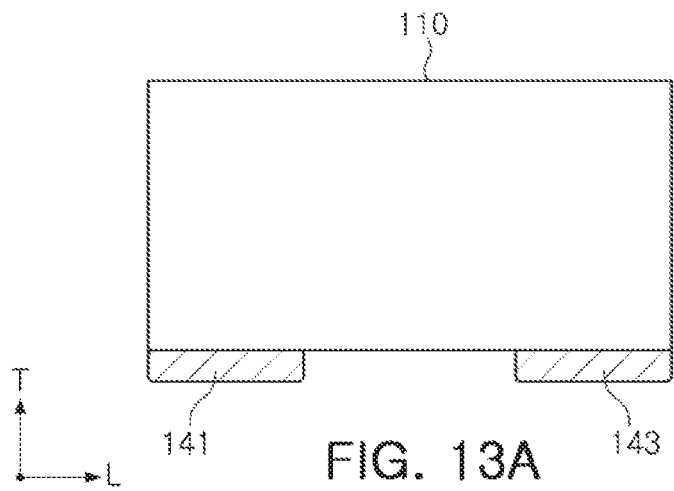
FIGS. 13A through 13C are views schematically illustrating sequential steps of a method of manufacturing a capacitor according to an exemplary embodiment.
Figure 13B:
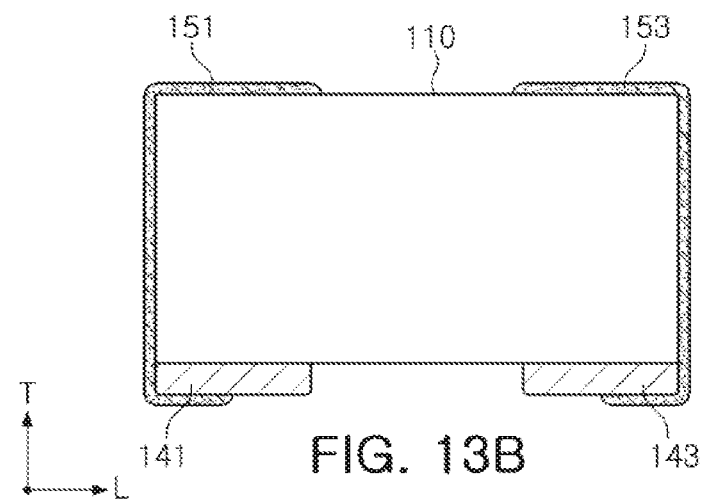
Figure 13C:
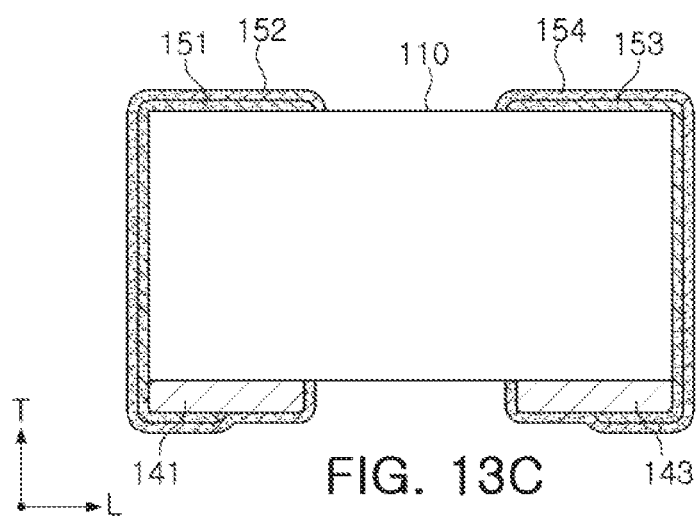

FIGS. 13A through 13C are views schematically illustrating a method of manufacturing a capacitor according to an exemplary embodiment.

Referring to FIG. 13A, the laminate onto which the external electrode paste patterns are applied may be sintered to obtain the body 110 on which the external electrodes 141 and 143 are formed.

The external electrode paste patterns may be formed to be spaced apart from edges of one surface of the laminate, may be formed to the edges of the one surface of the laminate, or may be extended onto portions of surfaces of the laminate connected to the one surface of the laminate.

Next, referring to FIGS. 13B and 13C, the auxiliary external electrodes may be formed on the body on which the external electrodes are formed, and the plating layers 152 and 154 may be formed.

The auxiliary external electrodes 151 and 153 may be formed of a metal, unlike the external electrodes containing glass.

The auxiliary external electrodes 151 and 153 may be formed to cover portions of the external electrodes.

The auxiliary external electrodes 151 and 153 may be formed on surfaces of the body and the external electrodes.

When the body 110 has one surface and the other surface opposing the one surface, the auxiliary external electrodes 151 and 153 may be extended from the external electrodes 141 and 143 to the other surface of the body or be extended from the external electrodes 141 and 143 to surfaces of the body connecting the one surface of the body and the other surface of the body to each other.

The auxiliary external electrodes 151 and 153 are not directly connected to the internal electrodes, but may be indirectly connected to the internal electrodes through the external electrodes.

The auxiliary external electrodes 151 and 153 may serve as the seed layers for forming the plating layers 152 and 154.

The auxiliary external electrodes 151 and 153 may be formed at a thickness of 0.05 µm to 10 µm, that is, a minimum thickness.

The auxiliary external electrodes 151 and 153 may be formed by one or more of a wet coating method and a dry coating method.

The wet coating method may be a dipping method, and the dry coating method may be a sputtering method. However, the wet coating method and the dry coating method are not limited thereto.

In a case of the dipping method, the auxiliary external electrodes 151 and 153 may be formed by dipping the body on which the external electrodes are formed in metal ink, nano-particle liquid-metal ink, or the like, and then heat-treating the dipped body. In this case, a thickness of the auxiliary external electrode(s) may be 5 µm to 10 µm.

In a case of low viscosity metal ink among several kinds of metal ink, metal ions or nano particles are dispersed in a low viscosity dispersing agent, and a metal may be grown by heat-treating the body on which the external electrodes are formed at a temperature of 200° C. to 500° C., a temperature lower than an existing metal firing temperature. In this case, since metal particles have a small size, a thin metal layer may be formed.

Since the metal ink does not contain an inorganic oxide such as glass, when the metal ink is applied to the body on which the external electrodes are formed and the body to which the metal ink is applied is heat-treated, the auxiliary external electrode formed of metal particles may be obtained.

In a case of the sputtering method, one method of forming a thin film and a physical depositing technology of depositing ions formed by allowing particles of a target to be in anion state using plasma and applying an electric field to the particles in the ion state on a board may be used, and the auxiliary external electrode may be formed as a thin film having a thickness of 0.2 µm to 1 µm.

The target may be one of copper (Cu), titanium (Ti), nickel (Ni), and silver (Ag).

Since the auxiliary external electrodes have a minimum thickness, they may include the non-connecting portions exposing the surfaces of the body.

When a plating process is performed after the auxiliary external electrodes are formed, the plating layers 152 and 154 having a uniform thickness may be formed on surfaces of the external electrodes and the auxiliary external electrodes. That is, the plating layers may be formed on the surfaces of the auxiliary external electrodes, and areas of the plating layers may be increased at the time of forming the capacitor on the circuit board later, such that adhesion strength between the capacitor and the circuit board may be improved.

As set forth above, the capacitor according to an exemplary embodiment may include the auxiliary external electrodes formed on the side surfaces of the body, such that the capacitance of the capacitor may be significantly increased, the adhesion strength between the capacitor and the circuit board may be improved at the time of mounting the capacitor on the circuit board, and workability and facilitation of loading work at the time of loading the capacitor may be improved.

While exemplary embodiments have been shown and described above, it will be apparent to those skilled in the art that modifications and variations could be made without departing from the scope of the present invention as defined by the appended claims.

What is claimed is:

1. A capacitor comprising:
a body including first internal electrodes having first lead portions exposed to one surface of the body, and second internal electrodes stacked alternately with the first internal electrodes with respective dielectric layers interposed therebetween and having second lead portions exposed to the one surface of the body;
first and second external electrodes disposed on the one surface of the body and electrically connected to the first and second internal electrodes, respectively; and
first and second auxiliary external electrodes electrically connected to the first and second external electrodes, respectively, and covering portions of surfaces of the body connected to the one surface of the body,
wherein the first and second auxiliary external electrodes are extended from the first and second external electrodes to contact surfaces of the body.

2. The capacitor of claim 1, wherein the first and second auxiliary external electrodes are formed of a metal.

3. The capacitor of claim 2, wherein the first and second auxiliary external electrodes are formed of copper (Cu).

4. The capacitor of claim 1, wherein the first and second auxiliary external electrodes are disposed on surfaces of the body and on the first and second external electrodes, respectively.

5. The capacitor of claim 1, wherein the first and second auxiliary external electrodes are disposed to cover portions of the first and second external electrodes, respectively.

6. The capacitor of claim 1, wherein the first and second auxiliary external electrodes are extended to cover surfaces of the body connecting the one surface of the body to another surface of the body disposed opposite to the one surface.

7. The capacitor of claim 1, wherein the first and second auxiliary external electrodes are extended to cover surfaces of the body connecting the one surface of the body to another surface of the body disposed opposite to the one surface, and to cover portions of the other surface of the body disposed opposite to the one surface.

8. The capacitor of claim 1, wherein the first and second auxiliary external electrodes each have a thickness of 0.05 µm to 10 µm.

9. The capacitor of claim 1, wherein the first and second auxiliary external electrodes each include non-connecting portions exposing surfaces of the body.

10. The capacitor of claim 1, wherein the first and second external electrodes are disposed to be spaced apart from edges of the one surface of the body.

11. The capacitor of claim 1, wherein the first and second external electrodes are disposed to have side surfaces thereof aligned with edges of the one surface of the body.

12. The capacitor of claim 1, wherein the first and second external electrodes are extended onto portions of surfaces of the body connected to the one surface of the body.

13. The capacitor of claim 1, further comprising plating layers disposed on the first and second external electrodes and the first and second auxiliary external electrodes.

14. The capacitor of claim 1, wherein the one surface of the body is a lower surface of the body.

15. A capacitor comprising:
a body having an upper surface, a lower surface, and side surfaces connecting the upper surface and the lower surface to each other, and including first and second internal electrodes respectively having first and second lead portions exposed to the lower surface;
first and second external electrodes disposed on the lower surface of the body and electrically connected to the first and second lead portions of the first and second internal electrodes, respectively; and
first and second auxiliary external electrodes electrically connected to the first and second external electrodes, respectively, and disposed on portions of both side surfaces of the body, respectively,
wherein the first and second auxiliary external electrodes are extended from the first and second external electrodes to contact surfaces of the body.

16. The capacitor of claim 15, wherein the first and second auxiliary external electrodes are disposed on surfaces of the body and respectively on the first and second external electrodes.

17. The capacitor of claim 15, wherein the first and second auxiliary external electrodes are disposed to cover portions of the first and second external electrodes.

18. The capacitor of claim 15, wherein the first and second auxiliary external electrodes are extended to cover respective side surfaces of the body and portions of the upper surface of the body.

19. The capacitor of claim 15, wherein the first and second auxiliary external electrodes include non-connecting portions exposing surfaces of the body.

20. A capacitor comprising:
a body including first and second internal electrodes stacked alternately with dielectric layers interposed therebetween, wherein each of the first and second internal electrodes extends to only one same outer surface of the body;
first and second external electrodes each disposed on the same outer surface of the body, and respectively connected to the first and second internal electrodes; and
first and second auxiliary external electrodes connected to the first and second external electrodes and disposed on different respective surfaces of the body other than the one same outer surface of the body,
wherein the first and second auxiliary external electrodes are extended from the first and second external electrodes to contact surfaces of the body.

21. The capacitor of claim 20, wherein each of the first and second external electrodes is spaced apart from edges of the same outer surface of the body on which the first and second external electrodes are disposed.

22. The capacitor of claim 20, wherein each of the first and second external electrodes has a side surface that is aligned with an edge of the same outer surface of the body on which the first and second external electrodes are disposed.

23. The capacitor of claim 20, wherein each of the first and second external electrodes extends to be disposed on a respective one of the different respective surfaces of the body having the first or second auxiliary external electrode thereon.

24. The capacitor of claim 20, wherein the first and second auxiliary external electrodes include a metal different from a metal of the first and second external electrodes.

25. The capacitor of claim 20, wherein the first and second auxiliary external electrodes each cover at least one surface of a respective one of the first and second external electrodes.

26. The capacitor of claim 20, wherein the first and second auxiliary external electrodes are respectively indirectly connected to the first and second internal electrodes through the first and second external electrodes, respectively.

27. A method of manufacturing a capacitor, comprising:
   stacking dielectric layers on which internal electrode patterns are formed to form a laminate having the internal electrode patterns exposed to one surface thereof;
   applying external electrode paste patterns to the one surface of the laminate;
   firing the laminate and the external electrode paste patterns to obtain a body on which external electrodes are formed; and
   forming auxiliary external electrodes electrically connected to the external electrodes and covering portions of surfaces of the body connected to the one surface of the body,
   wherein the auxiliary external electrodes are formed to extend from the external electrodes to contact surfaces of the body.

28. The method of claim 27, wherein the auxiliary external electrodes are formed by one or more of a wet method and a dry method.

29. The method of claim 27, wherein the auxiliary external electrodes are formed of a metal.

30. The method of claim 27, wherein the auxiliary external electrodes are formed on surfaces of the body and on the external electrodes.

31. The method of claim 27, wherein the auxiliary external electrodes are extended to cover surfaces of the body connecting the one surface of the body to another surface of the body opposite to the one surface of the body, and to cover portions of the other surface of the body disposed opposite to the one surface of the body.

32. The method of claim 27, wherein the auxiliary external electrodes are extended to cover surfaces of the body connecting the one surface of the body to another surface of the body opposite to the one surface of the body.

33. The method of claim 27, wherein the auxiliary external electrodes have a thickness of 0.05 μm to 10 μm.

34. The method of claim 27, wherein the auxiliary external electrodes include non-connecting portions exposing surfaces of the body.

35. The method of claim 27, wherein the external electrode paste patterns are formed to be spaced apart from edges of the one surface of the laminate.

36. The method of claim 27, wherein the external electrode paste patterns are formed to have side surfaces aligned with edges of the one surface of the laminate.

37. The method of claim 27, wherein the external electrode paste patterns are extended to cover portions of surfaces of the laminate connected to the one surface of the laminate.

38. An assembly comprising:
   a circuit board having first and second contacts disposed thereon; and
   a capacitor bonded to the first and second contacts,
   wherein the capacitor includes:
      a body including first and second internal electrodes stacked therein, wherein the first and second internal electrodes extend to a same outer surface of the body,
      first and second external electrodes disposed on the same outer surface of the body and respectively connected to the first and second internal electrodes,
      first and second auxiliary external electrodes disposed on different outer surfaces of the body and each connected to a respective one of the first and second external electrodes, and
      first and second plating layers respectively disposed on the first and second auxiliary external electrodes and respectively bonded to the first and second contacts of the circuit board,
      wherein the first and second auxiliary external electrodes are extended from the first and second external electrodes to contact surfaces of the body.

39. The assembly of claim 38, wherein the capacitor is bonded to the first and second contacts such that the same outer surface of the body having the first and second external electrodes thereon faces the circuit board.

40. The assembly of claim 38, wherein the first and second internal electrodes extend to only the same outer surface of the body from among all outer surfaces of the body.

41. The assembly of claim 38 wherein the first and second external electrodes are disposed on only the same outer surface of the body from among all outer surfaces of the body.

42. The assembly of claim 41, wherein the first and second auxiliary external electrodes are respectively indirectly connected to the first and second internal electrodes through the first and second external electrodes, respectively.

* * * * *